United States Patent
Lo

(10) Patent No.: US 9,832,894 B1
(45) Date of Patent: Nov. 28, 2017

(54) SECURE ELECTRONIC DEVICE AND DISASSEMBLING TOOL

(71) Applicants:HONG FU JIN PRECISION INDUSTRY (ShenZhen) CO., LTD., Shenzhen (CN); HON HAI PRECISION INDUSTRY CO., LTD., New Taipei (TW)

(72) Inventor: Wu-Jen Lo, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/215,901

(22) Filed: Jul. 21, 2016

(30) Foreign Application Priority Data

May 25, 2016 (TW) .............................. 105116187 A

(51) Int. Cl.
  *H05K 5/02* (2006.01)
  *G06F 1/18* (2006.01)
  *H05K 5/00* (2006.01)
  *B25B 27/02* (2006.01)
  (Continued)

(52) U.S. Cl.
  CPC ........... *H05K 5/0221* (2013.01); *B25B 27/02* (2013.01); *H05K 5/0013* (2013.01); *H05K 5/0208* (2013.01); *G06F 1/186* (2013.01); *G06K 13/0806* (2013.01); *H05K 7/1411* (2013.01)

(58) Field of Classification Search
  CPC .. H05K 5/0221; H05K 5/0208; H05K 5/0013; H05K 5/0217; H05K 7/1411; B25B 27/02; G06F 1/184–1/187; G06F 1/186; G06K 13/0806
  See application file for complete search history.

(56) References Cited

U.S. PATENT DOCUMENTS

| | | | | |
|---|---|---|---|---|
| 5,630,330 A | * | 5/1997 | Kung | ................... G11B 33/005 360/137 |
| 6,170,304 B1 | * | 1/2001 | Ohta | ...................... E05B 67/36 70/14 |
| 6,588,242 B1 | | 7/2003 | Beaty | |

(Continued)

FOREIGN PATENT DOCUMENTS

| | | |
|---|---|---|
| CN | 100520093 C | 7/2009 |
| CN | 105451481 A | 3/2016 |

(Continued)

*Primary Examiner* — Dimary Lopez Cruz
*Assistant Examiner* — Abhishek Rathod
(74) *Attorney, Agent, or Firm* — ScienBiziP, P.C.

(57) ABSTRACT

A secure electronic device with matching disassembling tool includes a housing and an electronic element. The disassembling tool includes a securing member, a first elastic disassembling member, and a second disassembling member. The securing member is mounted to the housing. The securing member includes an elastic locking block locked to the electronic element. The first elastic disassembling member can reach and be inserted into the securing member. The second disassembling member is inserted in the first disassembling member. When the second disassembling member is then rotated, the first disassembling member is deformed to press the elastic locking block, which unlocks from the electronic element.

16 Claims, 8 Drawing Sheets

(51) Int. Cl.
*H05K 7/14* (2006.01)
*G06K 13/08* (2006.01)

(56) References Cited

U.S. PATENT DOCUMENTS

| | | | | |
|---|---|---|---|---|
| 8,491,320 | B2* | 7/2013 | Zhang | G06K 13/08 439/159 |
| 9,210,821 | B2* | 12/2015 | Lin | H05K 5/0221 |
| 2006/0274511 | A1* | 12/2006 | Choi | G06K 13/08 361/754 |
| 2010/0051697 | A1* | 3/2010 | Long | G06K 13/085 235/486 |
| 2012/0056516 | A1* | 3/2012 | Fan | H05K 5/0221 312/223.2 |
| 2012/0317779 | A1* | 12/2012 | Myers | E05B 73/0005 29/428 |
| 2013/0003267 | A1* | 1/2013 | Pan | H04M 1/026 361/679.01 |
| 2014/0013809 | A1* | 1/2014 | Marshall | E05B 73/0082 70/18 |
| 2014/0034798 | A1* | 2/2014 | Lee | F16M 13/022 248/295.11 |
| 2014/0174138 | A1* | 6/2014 | Sheu | G07C 9/00182 70/344 |
| 2014/0306593 | A1* | 10/2014 | Gong | H05K 5/0221 312/326 |
| 2014/0347832 | A1* | 11/2014 | Li | G06F 1/18 361/759 |
| 2015/0188257 | A1* | 7/2015 | Lin | G06K 13/0812 439/159 |
| 2016/0120047 | A1* | 4/2016 | Chang | H05K 5/0221 361/679.01 |

FOREIGN PATENT DOCUMENTS

| | | |
|---|---|---|
| TW | 200706770 | 2/2007 |
| TW | 200834292 | 8/2008 |
| TW | M368880 U1 | 11/2009 |
| TW | M375918 U1 | 3/2010 |
| TW | 201208541 A1 | 2/2012 |

\* cited by examiner

SECURE ELECTRONIC DEVICE AND DISASSEMBLING TOOL

CROSS-REFERENCE TO RELATED APPLICATIONS

This application claims priority to Taiwan Patent Application No. 105116187, filed on May 25, 2016, the contents of which are incorporated by reference herein.

FIELD

The subject matter herein generally relates to anti-tamper apparatuses to be employed to electronic devices for assembling and disassembling electronic elements of the electronic device.

BACKGROUND

Electronic devices include electronic components, for example, circuit boards and adapters. The electronic component is mounted to the electronic device by screws. Thus, any person can disassemble the electronic component from the electronic device. When the electronic component is disassembled from the electronic device, the electronic device or content component may be copied.

BRIEF DESCRIPTION OF THE DRAWINGS

Implementations of the present technology will now be described, by way of example only, with reference to the attached figures.

DETAILED DESCRIPTION

Figure 1:
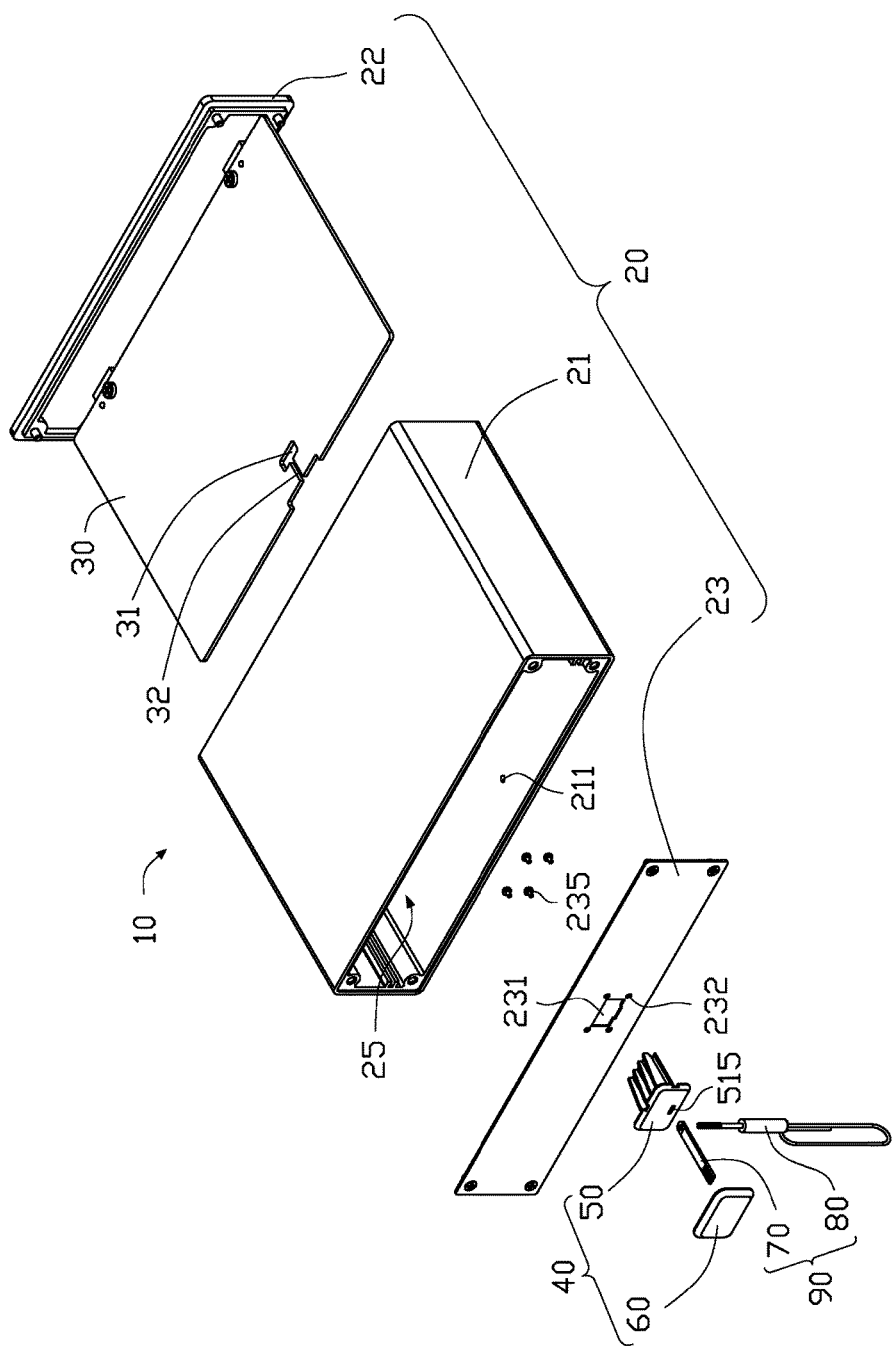
FIG. 1 is an exploded isometric view of an electronic device and matching disassembling tool.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

A definition that applies throughout this disclosure will now be presented.

The term "comprising" means "including, but not necessarily limited to"; it specifically indicates open-ended inclusion or membership in a so-described combination, group, series, and the like.

Figure 2:
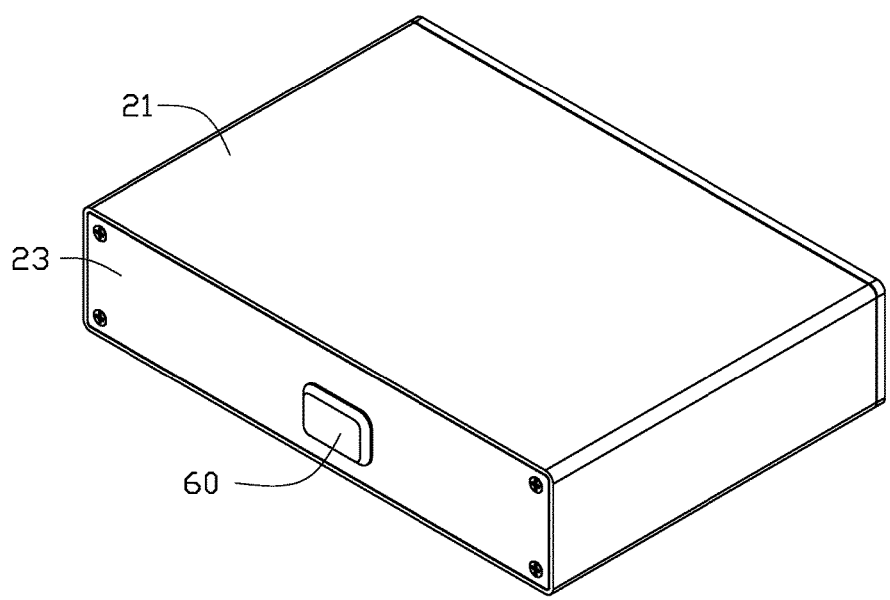
FIG. 2 is an isometric view of the electronic device of FIG. 1.

FIGS. 1 and 2 illustrate an electronic device 10 including a housing 20, an electronic element 30, and a securing member 40. A disassembling tool 90 can assemble and disassemble the electronic element 30. The disassembling tool 90 includes a first disassembling member 70 and a second disassembling member 80.

The housing 20 includes a case 21, a first wall 22 mounted to a front edge of the case 21, and a second wall 23 mounted to a second edge of the case 21, opposite to the first edge. The case 21, the first wall 22, and the second wall 23 together define a receiving space 25. The electronic element 30 is received in the receiving space 25. The first wall 22 and the second wall 23 are mounted to the case 21 by known means, such as screws. The case 21 defines a connecting hole 211 adjacent to the second wall 23. The second wall 23 defines an opening 231. The securing member 40 is mounted in the opening 231. The second wall 23 further defines a number of installing holes 232 surrounding the opening 231. A number of fastening members 235 can pass through the installing holes 232 to be inserted in the securing member 40 to fix the securing member 40 to the second wall 23.

The electronic element 30 is mounted to the first wall 22. The electronic element 30 defines a locking hole 31 at an end of the electronic element 30 adjacent to the second wall 23. The securing member 40 can be engaged in the locking hole 31. The electronic element 30 further defines a restricting groove 32 communicating with the locking hole 31. The restricting groove 32 is positioned between the locking hole 31 and the second wall 23. The electronic element 30 is mounted to an inner side of the first wall 22 adjacent to the second wall 23. When the first wall 22 moves, the electronic element 30 moves with the first wall 22. The electronic element 30 can be a circuit board. The electronic element 30 is mounted to the first wall 22 by known means, such as screws.

Figure 3:
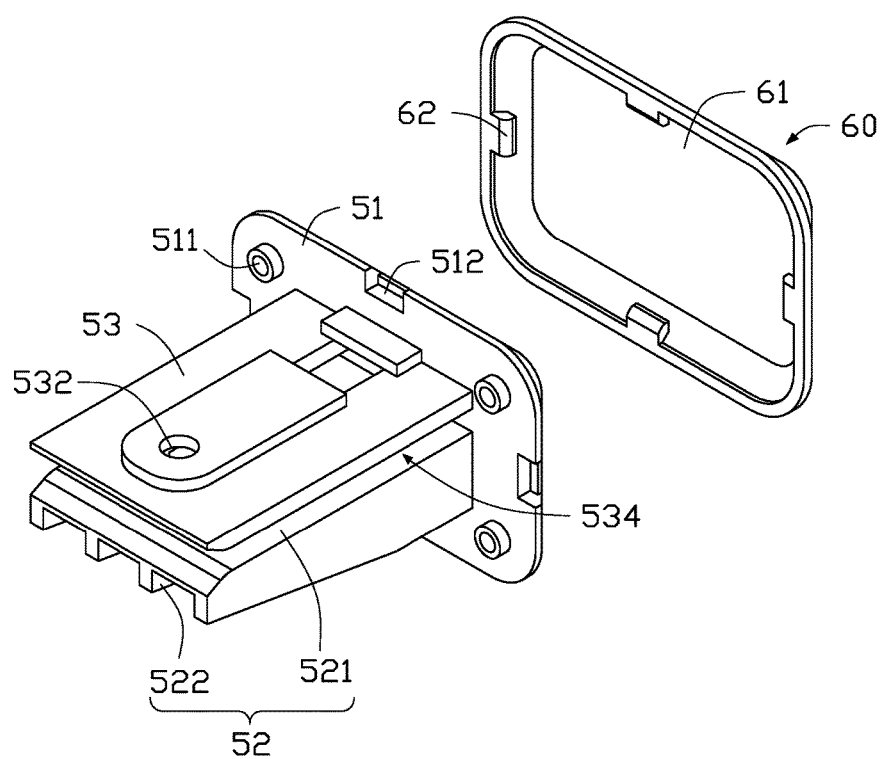
FIG. 3 is an exploded isometric view of a securing member in the electronic device of FIG. 1
Figure 4:
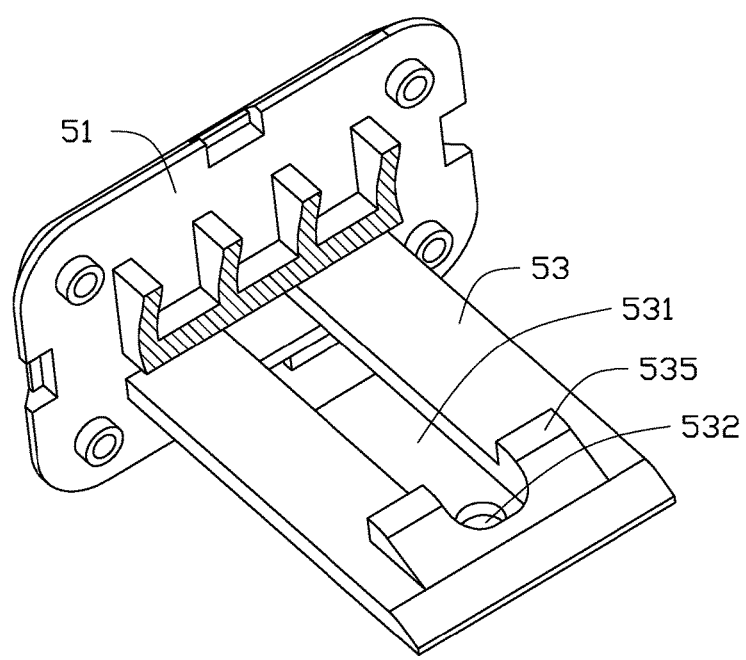
FIG. 4 is a cross-sectional view of a latching member of the securing member of FIG. 3.

FIGS. 1, 3, and 4 illustrate the securing member 40 which includes a latching member 50 and a cover 60 locked to the latching member 50. The latching member 50 includes a fastening plate 51, a restriction plate 52, and a locking plate 53. The restriction plate 51 and the locking plate 53 are mounted to a same side of the fastening plate 51. The restriction plate 52 and the locking plate 53 pass through the opening 231 to be positioned inside the second wall 23. The fastening plate 51 is positioned outside of the second wall 23 and covers the opening 231. The fastening plate 51 defines a number of fastening holes 511 adjacent to the edge thereof. The fastening holes 511 are aligned with the installing holes 232. The fastening members 235 pass through the installing holes 232 and the fastening holes 511 to fix the fastening plate 51 to the second wall 23.

An edge of the fastening plate 51 defines a number of locking grooves 512. An inserting hole 515 is defined at one side of the fastening plate 51 away from the second wall 23. The cover 60 defines a receiving cavity 61 at the middle thereof. The fastening plate 51 is received in the receiving cavity 61. The cover 60 includes a number of elastic hooks 62 surrounding the receiving cavity 61 and corresponding to the locking grooves 512. The elastic hooks 62 extend toward the receiving cavity 61. The elastic hooks 62 are deformable and can be locked in the locking grooves 512 to fix the cover 60 over the inserting hole 515 on a side of the fastening plate 51 away from the second wall 23.

Figure 7:
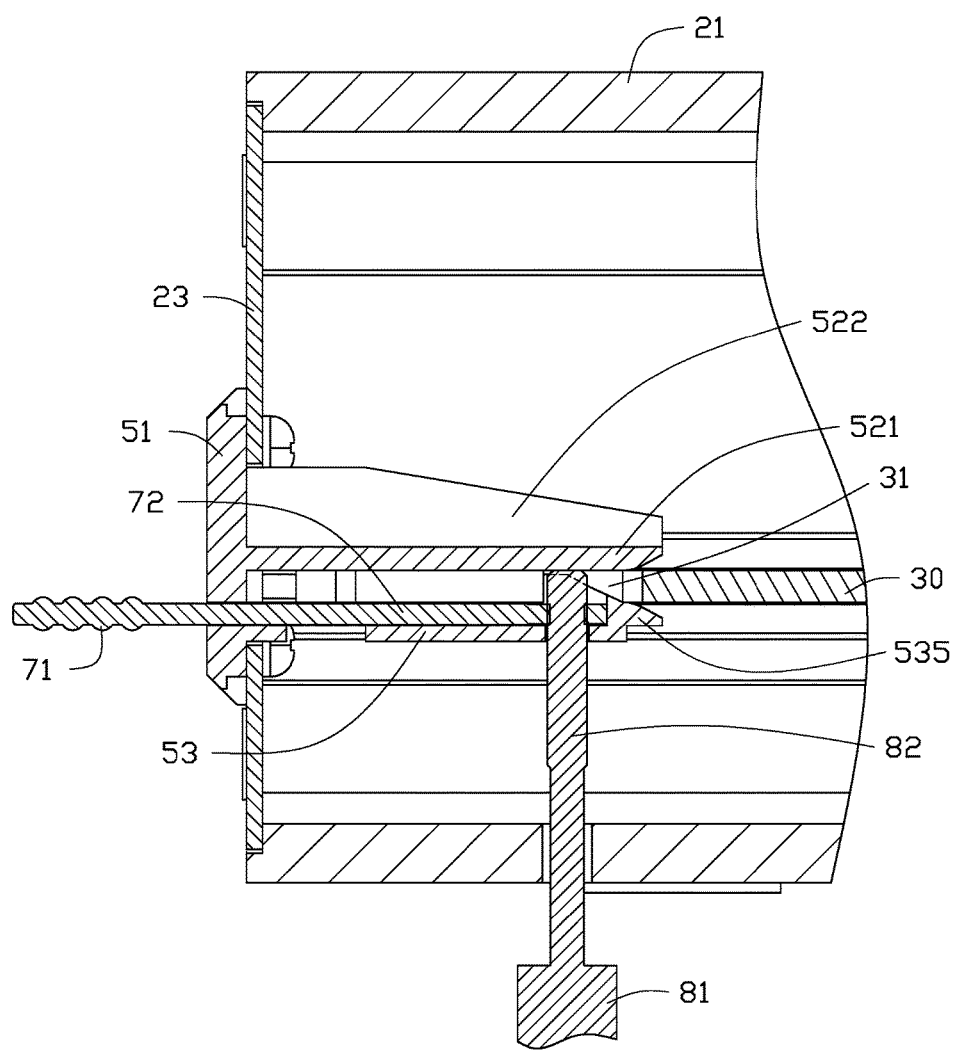
FIG. 7 is a cross-sectional view taken along the line VII-VII of FIG. 6, with the securing member locked to an electronic element.

The restriction plate 52 includes a rigid base plate 521 and a number of reinforcing blocks 522 perpendicularly extending from and increasing the rigidity of the rigid base plate 521. FIG. 7 illustrates the reinforcing blocks 522 abutting against the second wall 23. The locking plate 53 is parallel to the rigid base plate 521. An interval 534 is defined between the locking plate 53 and the rigid base plate 521. The interval 534 communicates with the inserting hole 515. The electronic element 30 is received in the interval 534. The locking plate 53 defines an inserting groove 531 facing the rigid base plate 521. The inserting groove 531 communicates with the inserting hole 515. The locking plate 53 further defines a through hole 532 below the inserting groove 531. The through hole 532 communicates with the inserting groove 531 and is aligned with the connecting hole 211. The locking plate 53 includes two locking blocks 535 at an end of the inserting groove 531 away from the fastening plate 51. The inserting groove 531 is positioned between the two locking blocks 535. The locking blocks 535 abut against the electronic element 30.

Figure 5:
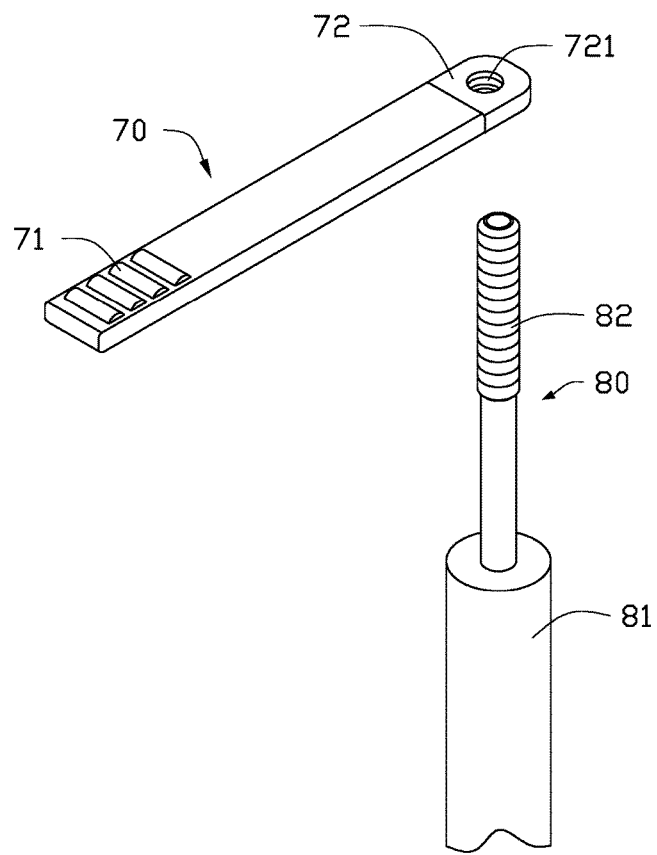
FIG. 5 is an exploded isometric view of a first disassembling member and a second disassembling member of the disassembling tool in FIG. 1.

FIGS. 1 and 5 illustrate that the first disassembling member 70 includes a holding portion 71 and a disassembling portion 72 at the opposite end of the dissembling member from the holding portion 71. The disassembling portion 72 defines a screw hole 721. The disassembling portion 72 fits inside the inserting groove 531. The second disassembling member 80 includes a rotating portion 81 and an inserting portion 82 extending from an end of the rotating portion 81. When the rotating portion 81 is rotated, so does the inserting portion 82. The inserting portion 82 includes an external thread on the inserting portion 82. The inserting portion 82 can be screwed to the screw hole 721 and is rotatable in the screw hole 721.

In FIGS. 1 and 7, when assembling the electronic element 30, the electronic element 30 is aligned with the interval 534 and the first wall 22 is pushed toward the case 21 to enable the electronic element 30 to abut against the locking block 535. The locking block 535 is deformed to enable the electronic element 30 to slide toward the fastening plate 51 along the interval 534. When the electronic element 30 slides as far as the locking hole 31 aligned with the blocking block 535, the locking block 535 rebounds to engage in the locking hole 31, to fix the electronic element 30 to the latching member 50. When the electronic element 30 is fixed to the latching member 50, the first wall 22 abuts against the front edge of the case 21. The first wall 22 is mounted to the front edge of the case 21. The electronic element 30 is thereby mounted in the electronic device 10.

Figure 6:
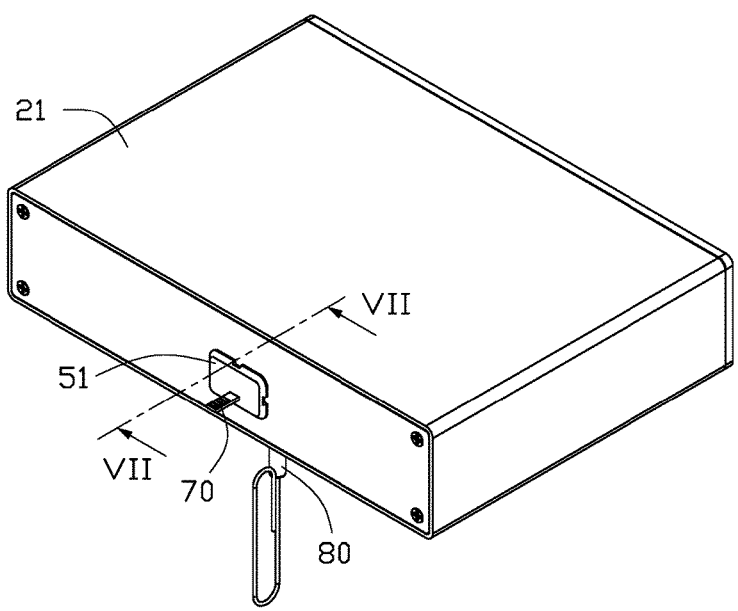
FIG. 6 is an isometric view of the electronic device with disassembling tool of FIG. 1.
Figure 8:
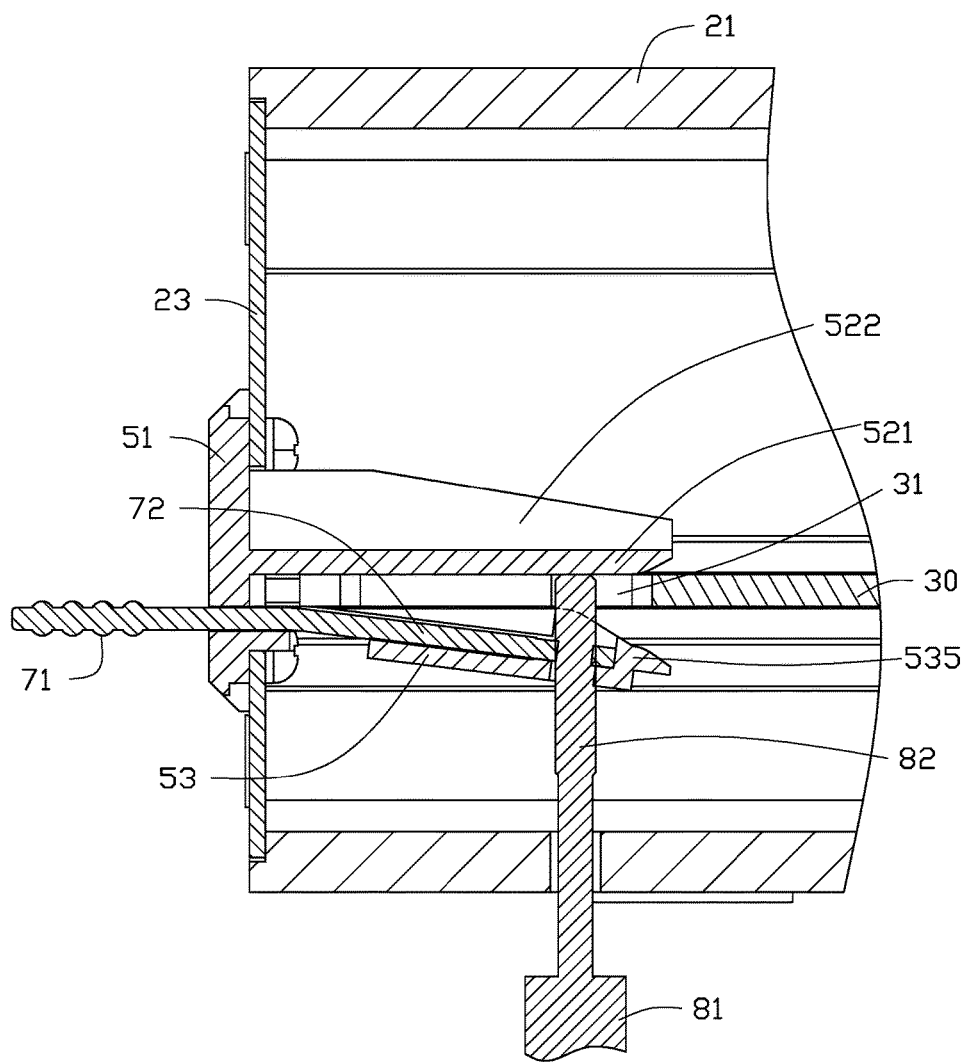
FIG. 8 is similar to FIG. 7, but with the securing member unlocked from the electronic element.

In FIGS. 6-8, when disassembling the electronic element 30, the cover 60 is disassembled from the fastening plate 51. The disassembling portion 72 is inserted into the inserting hole 515 and slides to the inserting groove 531. When the disassembling portion 72 slides as far as an end of the inserting groove 531 away from the fastening plate 51, the screw hole 721 is aligned with the through hole 532. This enables the inserting portion 82 to pass through the connecting hole 211 and the through hole 532 to be received in the screw hole 721. The rotating portion 81 and inserting portion 82 can be rotated in the screw hole 721. The inserting portion 82 rotates to pass through the locking hole 31 to abut against the rigid base plate 521. When the inserting portion 82 abuts against the rigid base plate 521, the inserting portion 82 can no longer move forward. Thus, the disassembling portion 72 rotates around the rotating portion 82 to be bent toward and as far as the locking plate 53. The locking plate 53 is pressed to be bent away from the electronic element 30. The rotating portion 81 is rotated until the locking block 535 bends to unlock from the locking hole 31. Then the first wall 22 can be disassembled from the case 21. Then the first wall 22 is pushed away from the second wall 23 to enable the electronic element 30 to slide along the interval 534 to be taken out of the receiving space 25. The inserting portion 82 is adversely rotated to be pulled away from the restriction hole 32, the through hole 532 and the connecting hole 211 to take out of the inserting portion 82.

The embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. An electronic device comprising:
    a housing defining a receiving space and a connecting hole;
    an electronic element received in the receiving space; and
    a securing member comprising:
        a fastening plate mounted to the housing and defining an inserting hole;
        a restriction plate; and
        a locking plate parallel to the restriction plate, an interval is defined between the locking plate and the restriction plate, the locking plate comprising at least one elastic locking block positioned in the interval, the locking block is locked to the electronic element, the locking plate defining an inserting groove communicating with the inserting hole and a through hole below the inserting groove, the through hole aligned with the connecting hole.

2. The electronic device as claimed in claim 1, wherein the electronic element defines a locking hole, the elastic locking block locks in the locking hole.

3. The electronic device as claimed in claim 1, wherein the housing comprises a second wall, the second wall defines a plurality of installing holes, a plurality of fastening members pass through the installing holes to be mounted to the fastening plate.

4. The electronic device as claimed in claim 1, wherein the restriction plate and the locking plate are mounted to a same side of the fastening plate.

5. The electronic device as claimed in claim 1, wherein the restriction plate comprises a rigid base plate and a plurality of reinforcing blocks perpendicularly extending from the rigid base plate, and the reinforcing blocks abut against the housing.

6. The electronic device as claimed in claim 1, wherein the housing defines an opening, the restriction plate and the locking plate pass through the opening to be received in the receiving space.

7. The electronic device as claimed in claim 1, wherein two of the elastic locking blocks are positioned on the locking plate, and the inserting groove is positioned between the two elastic locking blocks.

8. The electronic device as claimed in claim 1, wherein the housing comprises a case, a first wall mounted to a front edge of the case, and a second wall mounted to a second edge of the case; and the case, the first wall, and the second wall together define the receiving space.

9. An electronic device comprising:
a housing defining a receiving space and a connecting hole;
an electronic element received in the receiving space; and
a securing member comprising:
a fastening plate mounted to the housing and defining an inserting hole;
a restriction plate; and
a locking plate spaced from the restriction plate, an interval being defined between the locking plate and the restriction plate, the locking plate defining an inserting groove communicating with the inserting hole and a through hole below the inserting groove, the through hole aligned with the connecting hole, the locking plate comprising at least one elastic locking block, an end of the electronic element is received in the interval and engaged with the locking block.

10. The electronic device as claimed in claim 9, wherein the electronic element defines a locking hole, the elastic locking block locks in the locking hole.

11. The electronic device as claimed in claim 9, wherein the housing comprises a second wall, the second wall defines a plurality of installing holes, a plurality of fastening members pass through the installing holes to be mounted to the fastening plate.

12. The electronic device as claimed in claim 9, wherein the restriction plate and the locking plate are mounted to a same side of the fastening plate.

13. The electronic device as claimed in claim 9, wherein the restriction plate comprises a rigid base plate and a plurality of reinforcing blocks perpendicularly extending from the rigid base plate, and the reinforcing blocks abut against the housing.

14. The electronic device as claimed in claim 9, wherein the housing defines an opening, the restriction plate and the locking plate pass through the opening to be received in the receiving space.

15. The electronic device as claimed in claim 9, wherein two of the elastic locking blocks are positioned on the locking plate, and the inserting groove is positioned between the two elastic locking blocks.

16. The electronic device as claimed in claim 9, wherein the housing comprises a case, a first wall mounted to a front edge of the case, and a second wall mounted to a second edge of the case; and the case, the first wall, and the second wall together define the receiving space.

\* \* \* \* \*